United States Patent
Chen et al.

(10) Patent No.: US 11,362,069 B2
(45) Date of Patent: Jun. 14, 2022

(54) THREE-DIMENSIONAL STACKING STRUCTURE AND MANUFACTURING METHOD THEREOF

(71) Applicant: Taiwan Semiconductor Manufacturing Co., Ltd., Hsinchu (TW)

(72) Inventors: Hsien-Wei Chen, Hsinchu (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/916,060

(22) Filed: Jun. 29, 2020

(65) Prior Publication Data

US 2021/0066255 A1     Mar. 4, 2021

Related U.S. Application Data

(60) Provisional application No. 62/892,568, filed on Aug. 28, 2019.

(51) Int. Cl.

| | |
|---|---|
| *H01L 25/065* | (2006.01) |
| *H01L 23/00* | (2006.01) |
| *H01L 21/56* | (2006.01) |
| *H01L 21/78* | (2006.01) |
| *H01L 25/00* | (2006.01) |

(52) U.S. Cl.
CPC ........ *H01L 25/0657* (2013.01); *H01L 21/561* (2013.01); *H01L 21/565* (2013.01); *H01L 21/78* (2013.01); *H01L 24/06* (2013.01); *H01L 24/08* (2013.01); *H01L 24/80* (2013.01); *H01L 25/50* (2013.01); *H01L 2224/06519* (2013.01); *H01L 2224/08145* (2013.01); *H01L 2224/80895* (2013.01); *H01L 2224/80896* (2013.01); *H01L 2225/06524* (2013.01); *H01L 2225/06541* (2013.01); *H01L 2225/06586* (2013.01); *H01L 2225/06589* (2013.01)

(58) Field of Classification Search
CPC ............... H01L 25/0657; H01L 24/80; H01L 2225/06589; H01L 2224/06519
See application file for complete search history.

(56) References Cited

U.S. PATENT DOCUMENTS

2019/0164914 A1*  5/2019  Hu ................. H01L 23/585
2021/0225790 A1*  7/2021  Chen ............... H01L 23/3107

* cited by examiner

*Primary Examiner* — Dale E Page
*Assistant Examiner* — Wilner Jean Baptiste
(74) *Attorney, Agent, or Firm* — JCIPRNET

(57) ABSTRACT

A stacking structure including a first die, a second die stacked on the first die, and a filling material is provided. The first die has a first bonding structure, and the first bonding structure includes first bonding pads and a first heat dissipating element. The second die has a second bonding structure, and the second bonding structure includes second bonding pads and a second heat dissipating element. The first bonding pads are bonded with the second bonding pads. The first heat dissipating element is connected to one first bonding pad of the first bonding pads and the second heat dissipating element is connected to one second bonding pad of the second bonding pads. The filling material is disposed over the first die and laterally around the second die. The first and second dies are bonded through the first and second bonding structures.

20 Claims, 8 Drawing Sheets

US 11,362,069 B2

THREE-DIMENSIONAL STACKING STRUCTURE AND MANUFACTURING METHOD THEREOF

CROSS-REFERENCE TO RELATED APPLICATION

This application claims the priority benefit of U.S. provisional application Ser. No. 62/892,568, filed on Aug. 28, 2019. The entirety of the above-mentioned patent application is hereby incorporated by reference herein and made a part of this specification.

BACKGROUND

Three-dimensional stacking, also called three-dimensional integration, of different devices and components at the wafer level is utilized for high-density integration. Three-dimensional stacking facilitates the fabrication of high density and decreased length of interconnects for volume reduction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
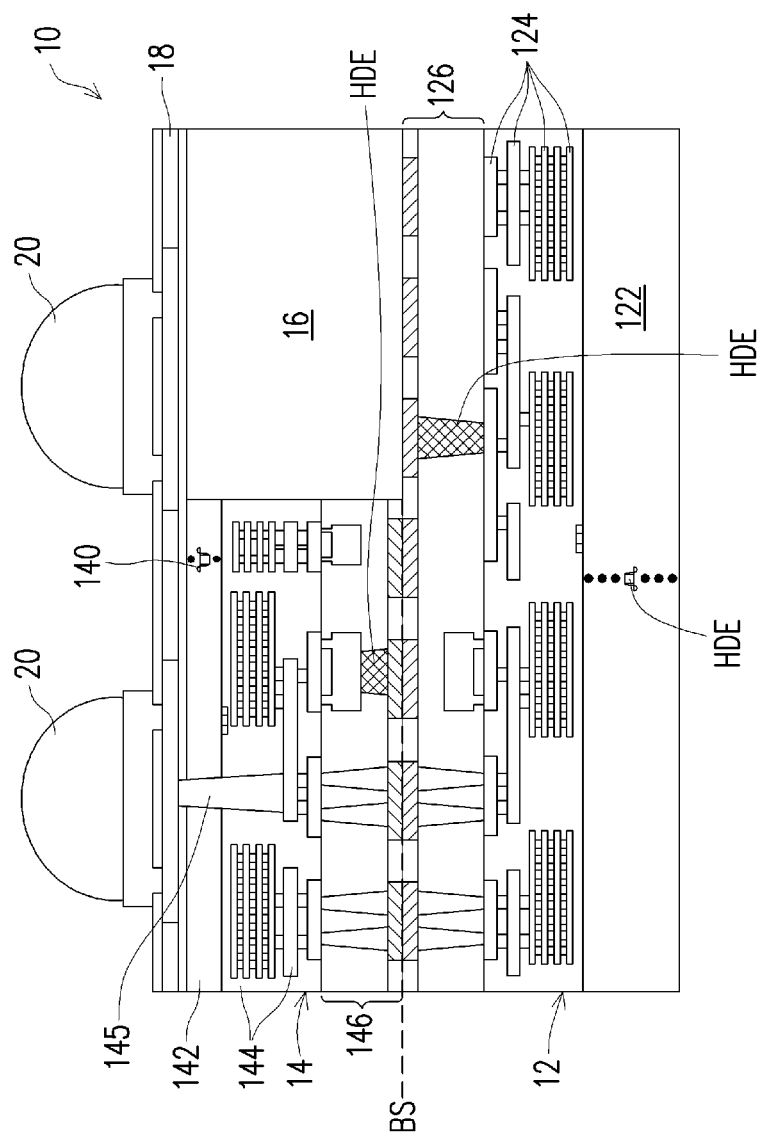
FIG. 1 is a perspective view of an exemplary three-dimensional stacking structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The specific embodiment(s) discussed herein is merely illustrative and is related to a three-dimensional (3D) integration structure or assembly, and does not limit the scope of the present disclosure. Embodiments of the present disclosure describe the exemplary manufacturing process of 3D stacking structures and the 3D stacking structures fabricated there-from. Certain embodiments of the present disclosure are related to the 3D stacking structures formed with wafer bonding structures and stacked wafers and/or dies. Other embodiments relate to 3D integration structures or assemblies including post-passivation interconnect (PPI) structures or interposers with other electrically connected components, including wafer-to-wafer assembled structures, die-to wafer assembled structures, package-on-package assembled structures, die-to-die assembled structures, and die-to-substrate assembled structures. The wafers or dies may include one or more types of integrated circuits or electrical components on a bulk semiconductor substrate or a silicon/germanium-on-insulator substrate. The embodiments are intended to provide further explanations but are not used to limit the scope of the present disclosure.

FIG. 1 illustrates a cross-sectional view of an exemplary 3D stacking structure in accordance with some embodiments of the present disclosure. In FIG. 1, the 3D stacking structure 10 comprises at least a first die 12, a second die 14 and a filling material 16 beside the second die 14 and on the first die 12. In some embodiments, the first die 12 includes a first semiconductor substrate 122, first metallization structures 124 formed over the first semiconductor substrate 122 and a first bonding structure 126 formed on first metallization structures 124. In some embodiments, the second die 14 includes a second semiconductor substrate 142, second metallization structures 144 formed over the second semiconductor substrate 142 and a second bonding structure 146 formed on second metallization structures 144. The first die 12 and the second die 14 are stacked face-to-face with the first bonding structure 126 connected with the corresponding second bonding structure 146. The first die 12 is hybrid-bonded with the second die 14 thus achieving a hybrid bonding interface BS (represented by the dotted line in FIG. 1). In some embodiments, the first die 12 includes semiconductor devices 120 formed in the first semiconductor substrate 122. In some embodiments, the second die 14 includes semiconductor devices 140 formed in the second semiconductor substrate 142. For example, the semiconductor devices 120 and 140 are electrically connected through the first and second metallization structures 124, 144 and the first and second bonding structures 126, 146.

In certain embodiments, as shown in FIG. 1, the 3D stacking structure 10 further comprises a redistribution layer (RDL) 18 disposed on the second die 14 and the filling material 16, and conductive terminals 20 located on the RDL 18. For example, the conductive terminals 20 may be electrically connected with the semiconductor devices 140 through the second metallization structures 144, at least one through substrate via (TSV) 145 penetrating through the semiconductor substrate 142 and the RDL 18. Also, the conductive terminals 20 may be electrically connected with the semiconductor devices 120 through the first and second metallization structures 124, 144, the first and second bonding structures 126, 146, the TSV 145 and the RDL 18. That is, the semiconductor devices 120 or 140 are electrically connected with the conductive terminals through different electrical connection paths. In some embodiments, the 3D stacking structure 10 comprises heat dissipating elements HDE in the first and second bonding structures 126, 146 for better thermal dissipation. The heat dissipating elements HDE does not function as electrical connection components, and are not parts of the electrical connection path of the 3D stacking structure 10.

Figure 2A:
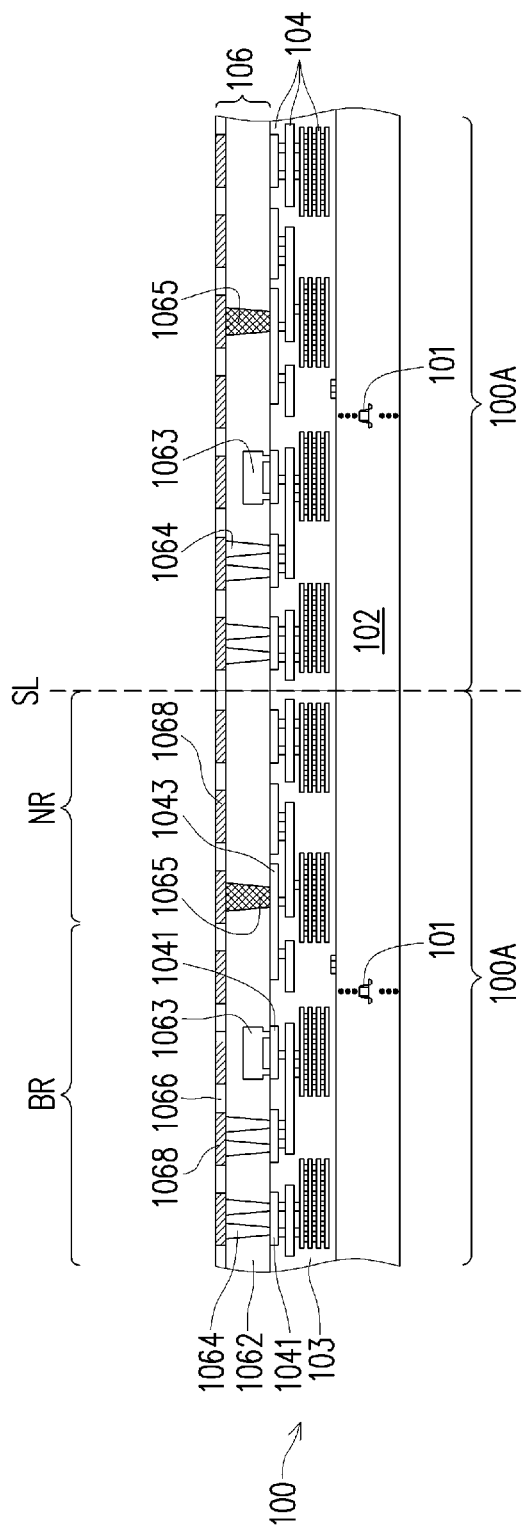
FIGS. 2A-2C are cross-sectional views showing various stages of the manufacturing method for forming the three-dimensional stacking structure according to some embodiments of the present disclosure.
Figure 2B:
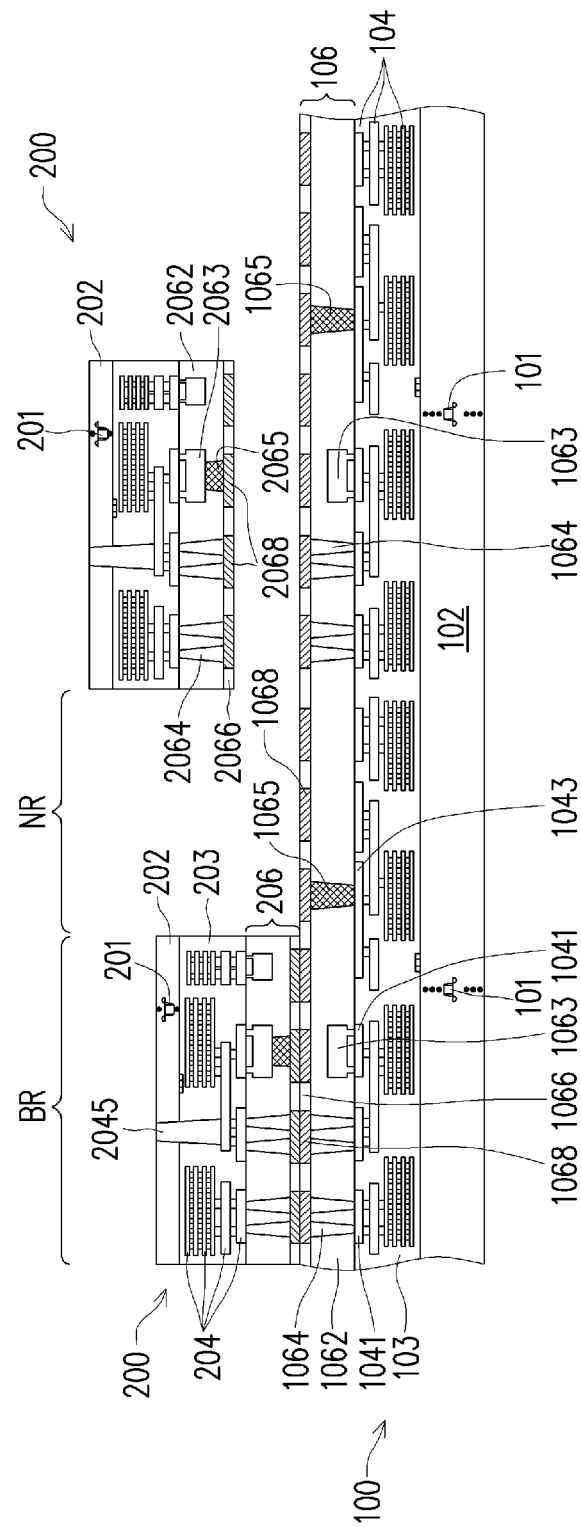
Figure 2C:
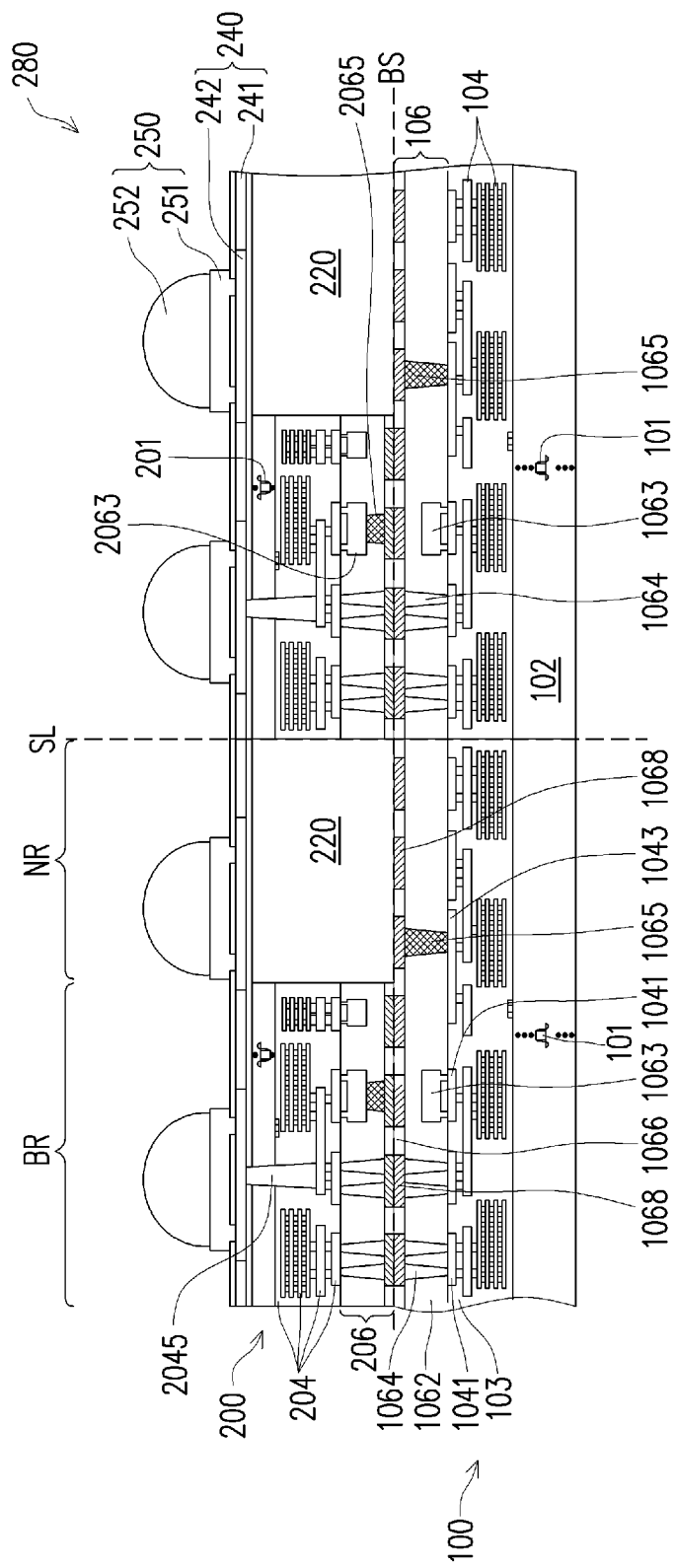

FIGS. 2A-2C illustrate the cross-sectional views showing various stages of the manufacturing methods for forming the 3D stacking structure according to some embodiments of the present disclosure. In FIG. 2A, in some embodiments, a first wafer 100 is provided, and the first wafer 100 includes first metallization structures 104 formed in a first semiconductor substrate 102 and first bonding structures 106 over the semiconductor substrate 102 and the first metallization structures 104. In some embodiments, the first wafer 100 is a semiconductor wafer made of silicon (such as a silicon bulk wafer) or other semiconductor materials, such as III-V semiconductor materials. In some embodiments, the first wafer 100 may be considered to have a plurality of first dies 100A before dicing or singulation (two die units are shown with the cutting lane SL in FIG. 2A). It is understood that the number of the first dies 100A is merely exemplary, and the first dies 100A may be the same type of dies or dies of the same functions. In certain embodiments, the semiconductor devices 101 may be formed in the semiconductor substrate 102 of the first wafer 100 during the front-end-of-line (FEOL) processes. In certain embodiments, the semiconductor devices are transistors, memories or power devices, or other devices such as capacitors, resistors, diodes, photodiodes, sensors or fuses. In exemplary embodiments, some of the semiconductor devices may be electrically connected with the first metallization structures 104.

As shown in FIG. 2A, in certain embodiments, the first metallization structures 104 are embedded within an insulation layer 103 formed on the semiconductor substrate 102. In some embodiments, the insulation layer 103 includes one or more low-k dielectric layers. In some embodiments, a material of the insulation layer 103 includes silicon oxide, a spin-on dielectric material, a low-k dielectric material or a combination thereof. In some embodiments, the first metallization structures 104 include multiple metallization layers of interconnect structures, including interconnected metal lines, vias and contact pads. In one embodiment, the topmost metallization layer of the first metallization structures 104 includes top metal patterns 1041 and top metal lines 1043. In certain embodiments, the materials of the metallization structures 104 include aluminum (Al), aluminum alloys, copper (Cu), copper alloys, titanium (Ti), tungsten (W), or combinations thereof. In exemplary embodiments, the semiconductor devices 101 are electrically connected with the metallization structures 104 and some of the semiconductor devices 101 are electrically interconnected through the metallization structures 104. In some embodiments, the first metallization structures 104 electrically connect the semiconductor devices 101 with the above bonding structures 106. The first metallization structures 104 shown herein are merely for illustrative purposes, and the metallization structures 104 may include other configurations and may include one or more through vias and/or damascene structures.

As shown in FIG. 2A, in some embodiments, the first bonding structures 106 are formed over the insulation layer 103 and the first metallization structures 104. In exemplary embodiments, the first bonding structures 106 function as hybrid bonding structures. The first bonding structures 106 include a dielectric material 1062, contact pads 1063 embedded in the dielectric material 1062 and bonding pad vias 1064 penetrating through the dielectric material 1062. In some embodiments, heat dissipating elements 1065 are included in the first bonding structures 106. In one embodiment, the heat dissipating element 1065 is located on the top metal line 1043 and penetrates through the dielectric material 1062. In some embodiments, the heat dissipating elements 1065 are located within the non-bonding regions NR of the first wafer 100, while the bonding pad vias 1064 and the contact pads 1063 are located within the bonding region BR of the first wafer 100. The contact pads 1063 are input/output (I/O) pads or aluminum pads, for example. In exemplary embodiments, the bonding pad vias 1064 and the heat dissipating elements 1065 are formed from the same process and are made of the same metal material. For example, the metal material includes Cu, copper alloys, aluminum (Al), aluminum alloys, titanium (Ti), nickel (Ni), or combinations thereof. In some embodiments, the heat dissipating element 1065 may be made of a thermally conductive material having a thermal conductivity equivalent to or larger than copper metal (e.g. about 385.0 W/m K).

In some embodiments, the first bonding structures 106 further include a first bonding film 1066 covering the dielectric material 1062 and first bonding pads 1068 embedded in the bonding film 1066, and the top surfaces of the first bonding pads 1068 are exposed from the first bonding film 1066, for hybrid bonding. In one embodiment, bonding pad vias 1064 are located below and connected with the bonding pads 1068. The bonding pad vias 1064 are electrically connected with the first metallization structures 104 and electrically connected with the semiconductor devices 101 in the semiconductor substrate 102. Also, in one embodiment, the heat dissipating elements 1065 are located below and connected with the bonding pads 1068. The heat dissipating elements 1065 may be connected with the first metallization structures 104 but are electrically unconnected with and electrically insulated from the semiconductor devices 101 in the semiconductor substrate 102. The bonding pads 1068 are located in the bonding regions BR and non-bonding regions NR of the first wafer 100. In some embodiments, the material of the first bonding film 1066 includes silicon oxide, silicon nitride, undoped silicate glass material or a combination thereof. In exemplary embodiments, the bonding pads 1068 are made of metal materials, such as copper (Cu), copper alloys, aluminum (Al), aluminum alloys, nickel (Ni), solder materials or combinations thereof.

In FIG. 2B, in some embodiments, second dies 200 are provided and stacked onto the first wafer 100. For example, the second dies 200 are disposed side-by-side on the top surface of the first wafer 100, and the second dies 200 are placed within the bonding regions BR of the first wafer 100. In certain embodiments, each second die 200 includes second metallization structures 204 formed in a second semiconductor substrate 202 and a second bonding structure 206 on the second metallization structures 204 below the second semiconductor substrate 202. In some embodiments, the second dies 200 are fabricated from a semiconductor wafer similar to the first wafer 100. In some embodiments, the second dies 200 are fabricated from a different type of a semiconductor wafer from the first wafer 100.

In certain embodiments, each of the second dies 200 includes semiconductor devices 201 and isolation structures (not shown) formed in the semiconductor substrate 202. As shown in FIG. 2B, the area or size of the second die 200 is smaller than the area or size of either one of the first dies 100A of the first wafer 100. It is understood that the number of the second dies 200 is merely exemplary, and the second dies 200 may be different type of dies from the first dies 100A. In alternative embodiments, the second dies 200 may be the same type of dies as the first dies 100A but the span (or size) of the second die is different from the span of the first dies 100A. In exemplary embodiments, some of the semiconductor devices 201 may be electrically connected with the second metallization structures 204.

In some embodiments, the first dies 100A and the second dies 200 have different functions. In some embodiments, the first dies 100A and the second dies 200 have the same functions but are of different sizes. In some embodiments, the first die 100A or the second die 200 includes a memory chip such as a high bandwidth memory chip, a dynamic random access memory (DRAM) chip or a static random access memory (SRAM) chip. In some alternative embodiments, the first die 100A or the second die 200 includes an application-specific integrated circuit (ASIC) chip, an analog chip, a sensor chip, a wireless application chip such as a Bluetooth chip and a radio frequency chip or a voltage regulator chip.

As shown in FIG. 2B, in certain embodiments, the second metallization structures 204 embedded in the insulation layer 203 may include configurations similar to the first metallization structures 104 in the first dies 100A of first wafer 100. In addition, the second metallization structures 204 further include through substrate vias (TSVs) 2045 penetrating through the semiconductor substrate 202 and extending into the insulating layer 203. In one embodiment, one end of the TSV 2045 is exposed from the semiconductor substrate 202 and the other end of the TSV 2045 contacts the metal line of the metallization structures 204. In one embodiment, the TSV 2045 has a tilted sidewall and has a shape of a truncated cone. In one embodiment, the TSV 2045 has a substantially vertical sidewall and a shape of a cylinder. In certain embodiments, the material of the second metallization structures 204 is the same as that of the first metallization structures 104. In certain embodiments, the material of the second metallization structures 204 is different from that of the first metallization structures 104.

Referring to FIG. 2B, in exemplary embodiments, the second bonding structure 206 formed on the insulation layer 203 and the metallization structures 204 functions as the hybrid bonding structure of the second dies 200. The second bonding structure 206 includes a dielectric material 2062, contact pads 2063 embedded in the dielectric material 2062 and bonding pad vias 2064 penetrating through the dielectric material 2062. In some embodiments, one or more heat dissipating elements 2065 are included in the second bonding structure 206. The second bonding structure 206 also includes a second bonding film 2066 covering the dielectric material 2062 and second bonding pads 2068 embedded in the bonding film 2066, and the top surfaces of the bonding pads 2068 are exposed from the second bonding film 2066, for hybrid bonding. In one embodiment, the heat dissipating element 2065 is located between the contact pad 2063 and the bonding pad 2068. In certain embodiments, the bonding pads 2068 are made of metal materials, such as copper (Cu), copper alloys, aluminum (Al), aluminum alloys, nickel (Ni), solder materials or combinations thereof. In exemplary embodiments, the bonding pad vias 2064 and the heat dissipating element 2065 are formed from the same process and are made of the same metal material. For example, the metal material includes Cu, copper alloys, aluminum (Al), aluminum alloys, titanium (Ti), nickel (Ni), or combinations thereof. In some embodiments, the material of the second bonding film 2066 includes silicon oxide, silicon nitride, undoped silicate glass material or a combination thereof. In one embodiment, the material of the second bonding film 2066 is the same as that of the first bonding film 1066. In one embodiment, the material of the second bonding film 2066 is different from that of the first bonding film 1066. In some embodiments, the heat dissipating element 2065 may be made of a thermally conductive material having a thermal conductivity equivalent to or larger than copper metal (e.g. 385.0 W/m K). The bonding pad vias 2064 are electrically connected with the second metallization structures 204 and electrically connected with the semiconductor devices 201 in the semiconductor substrate 202. The heat dissipating elements 2065 may be electrically connected with the second metallization structures 204 but are not electrically connected with the semiconductor devices 201 in the semiconductor substrate 202.

During the placement of the second dies 200, the second dies 200 are arranged to align the second bonding structures 206 with the corresponding first bonding structures 106 so that the bonding pads 2064 of the second die(s) are substantially vertically aligned with the bonding pads 1064 of the first wafer 100 respectively. In some embodiments, once the second dies 200 are placed on the first wafer 100, the second bonding film(s) 2066 of the second dies 200 contacts the first bonding film 1066 of the first wafer and the second bonding pads 2068 directly contacts the first bonding pads 1068 of the first wafer 100.

Then, in some embodiments, as shown in FIG. 2C, a bonding process is performed to bond the first and second bonding structures 106, 206 to each other so as to bond the second dies 200 with the first dies 100A of the first wafer 100. In some embodiments, the bonding process is a hybrid bonding process. In one embodiments, during the application of hybrid bonding technology, a low temperature heating process at a temperature of about 100° C. to about 200° C. is performed to heat and bond the first and second bonding films 1066, 2066 and a high temperature heating process is performed at a temperature of about 200° C. to about 300° C. to bond the first and second bonding pads 1068, 2068 with each other. In some embodiments, the second dies 200 are hybrid bonded to the first wafer 100 through hybrid bonding to form a die-stacked-on-wafer structure.

In some embodiments, in FIG. 2C, a filling material 220 is formed over the die-stacked-on-wafer structure, especially filling the gaps between the second dies 200 on the first wafer 100, to form a reconstructed wafer structure 280. In some embodiments, the filling material 220 at least laterally covers sidewalls of the second dies 200 mounted on the first wafer 100. In some embodiments, the filling material 220 covers the top side of the first wafer 100, fills the gaps between the second dies 200 and wraps around the sidewalls of the second dies 200. In some embodiments, the filling material 220 is an insulating layer. In one embodiment, the filling material 220 is formed by chemical vapor deposition (CVD), spin coating or molding. Optionally, a grinding process or a polishing process (such as a chemical mechanical polishing process) is performed to planarize the filling material to flush with the backsides of the second dies 200. In some embodiments, the material of the filling material 220 includes silicon oxide (SiOx), silicon nitride or silicon-containing resins. As the filling material 220 is formed directly on the first wafer 100, the filling material 220 is mainly located in the non-bonding region NR and in direct contact with the top surfaces of the first bonding pads 1068 located in the non-bonding region NR. In one embodiment, some or all of the first bonding pads 1068 located in the non-bonding region NR are electrically floating pads. In some embodiments, as shown in FIG. 2C, the heat dissipating elements 1065 are connected with the first bonding pads 1068 located in the non-bonding region NR and are located directly below the filling material 220. The heat dissipating elements 1065 are electrically unconnected with the semiconductor devices 101 in the first dies 100A (first wafer 100), and the heat dissipating elements 1065 are electrically floating elements.

In FIG. 2C, in some embodiments, a redistribution layer (RDL) 240 is formed over the reconstructed wafer structure 280 and is formed on the filling material 220 and the second dies 200. The redistribution layer (RDL) 240 is electrically connected to the second dies 200 through at least the TSVs 2045 of the second dies 200. In some embodiments, the RDL 240 includes redistribution patterns 242 embedded in a dielectric material layer 241. The configuration of the redistribution patterns is not limited by the disclosure, while the dielectric material layer may include more than one layers of dielectric materials. The redistribution patterns 242 includes routing patterns and pads, for example. In certain embodiments, the dielectric material layer 241 exposes some of the underlying redistribution patterns 242, and conductive terminals 250 are formed on the exposed patterns 242. In some embodiments, the conductive terminal 250 includes a metal post 251 and a bump 252. In some embodiments, the material of the dielectric material layer 241 includes silicon oxide, silicon nitride, low-k dielectric materials, benzocyclobutene (BCB), epoxy, polyimide (PI), or polybenzoxazole (PBO). In some embodiments, a material of the metal post 251 includes copper or cooper alloys, and a material of the bump 252 includes solder. In one embodiment, the metal posts 251 and bumps 252 located on the metal posts 251 constitute micro bumps. In some embodiments, the conductive terminals 250 include copper pillar bumps.

Later, in some embodiments, a singulation process is performed to cut the reconstructed wafer structure 280 along the cutting lanes SL into individual 3D stacking structures. In exemplary embodiments, these obtained 3D stacking structures are similar to the 3D stacking structure 10 described in FIG. 1. In some embodiments, the singulation process includes a wafer dicing process or a sawing process. After singulation, the singulated 3D stacking structure includes at least the first die 100A, the second die 200 and the filling material 220 wrapping around the second die 200. In some embodiments, through the metallization structures and hybrid bonding structures, electrical connection path(s) is established.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 3:
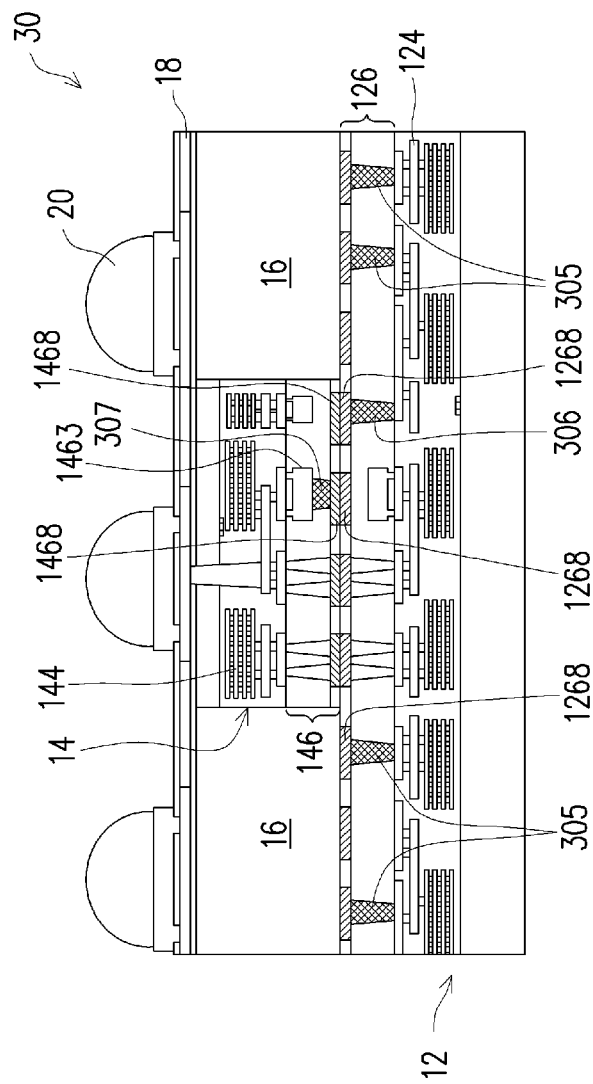
FIG. 3 is a perspective view of an exemplary three-dimensional stacking structure in accordance with some embodiments of the present disclosure.

FIG. 3 illustrates a cross-sectional view of an exemplary 3D stacking structure in accordance with some embodiments of the present disclosure. According to the embodiments, the same or similar elements may be labelled with the same reference numbers, and the details and descriptions of the same or similar elements will not be repeated herein for simplification.

In FIG. 3, the 3D stacking structure 30 comprises at least a first die 12, a second die 14 and a filling material 16 laterally surrounding the second die 14 and located on the first die 12. Similarly, the first die 12 includes the first bonding structure 126, and the second die 14 includes the second bonding structure 146. The first die 12 and the second die 14 are hybrid-bonded face-to-face through the first bonding structure 126 connected with the corresponding second bonding structure 146. In certain embodiments, the 3D stacking structure 20 comprises a redistribution layer (RDL) 18 disposed on the second die 14 and the filling material 16, and conductive terminals 20 located on the RDL 18. In some embodiments, the 3D stacking structure 30 comprises heat dissipating elements 305 and 306 that are embedded in the first bonding structure 126 of the first die 12 and connected to the bonding pads 1268 of the first bonding structure 126 as well as one or more heat dissipating elements 307 (only one is shown) that are embedded in the second bonding structure 146 of the second die 14 and are connected to the bonding pads 1468 of the second bonding structure 146. The heat dissipating elements 305, 306, 307 improve heat dissipation of the 3D stacking structure 30, especially enhancing heat dissipating from the dielectric material(s) of the bonding structures. The heat dissipating elements 305, 306, 307 are electrically unconnected with the semiconductor devices in the first and second dies 12, 14. For example, the heat dissipating elements 305 are located between the bonding pads 1268 and the first metallization structures 124 and under the filling material 16. As the bonding pads 1268 located under the filling material 16 are electrically floated (i.e. electrically floating pads), the heat dissipating elements 305 connected with the bonding pads 1268 are electrically floating. In embodiments, the heat dissipating elements 306 (only one is shown) are located between the bonding pads 1268 and the first metallization structures 124 and under the second die 14 (within the bonding region). In one embodiment, the bonding pads 1468, 1268 are electrically floating pads, and the heat dissipating element 306 connected with the bonding pads 1268, 1468 is electrically floating. Also, the heat dissipating element 307 is located between the bonding pad 1468 and the contact pad 1463 and between the bonding pad 1268 and the second metallization structures 144. The bonding pads 1468, 1268 are electrically floating pads, and the heat dissipating element 307 connected with the bonding pads 1268, 1468 is electrically floating. The heat dissipating elements mainly function for enhancing heat dissipation and do not function as electrical connection parts (i.e. not parts of the electrical connection path of the 3D stacking structure). That means the heat dissipating elements are electrically isolated from the semiconductor devices/dies within the 3D stacking structure.

Figure 4:
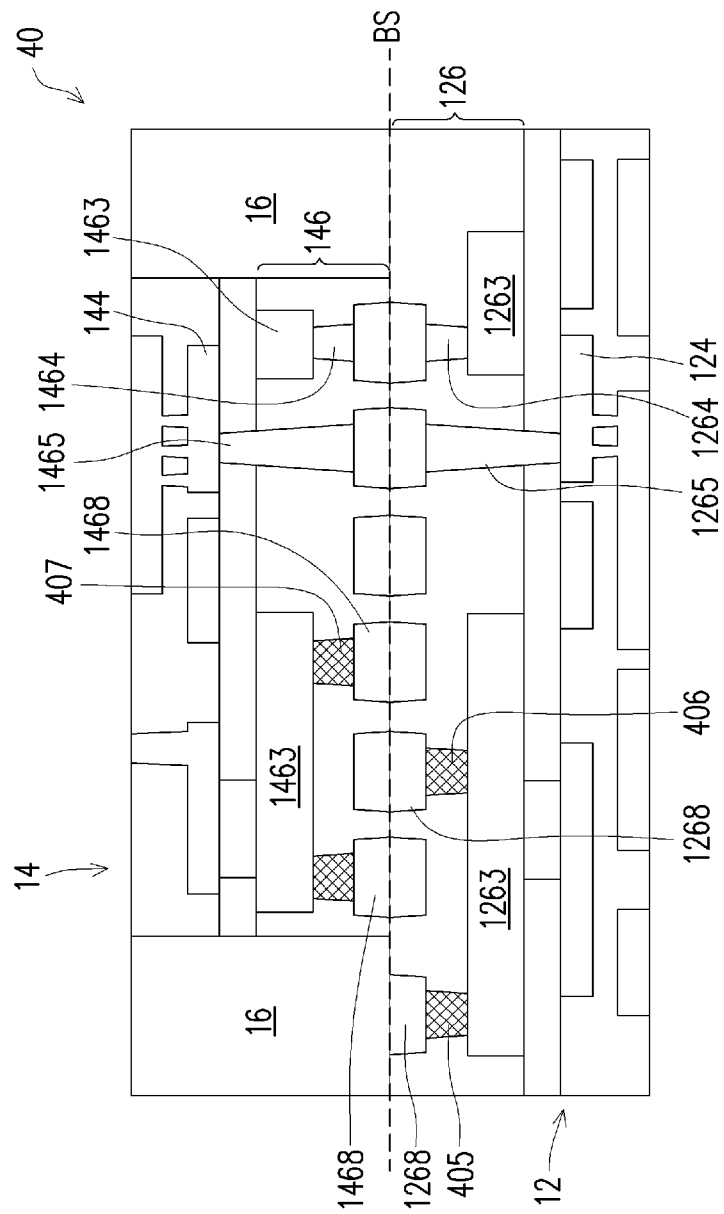
FIG. 4 illustrates a cross-sectional view of a portion of an exemplary 3D stacking structure in accordance with some embodiments of the present disclosure.
Figure 5:
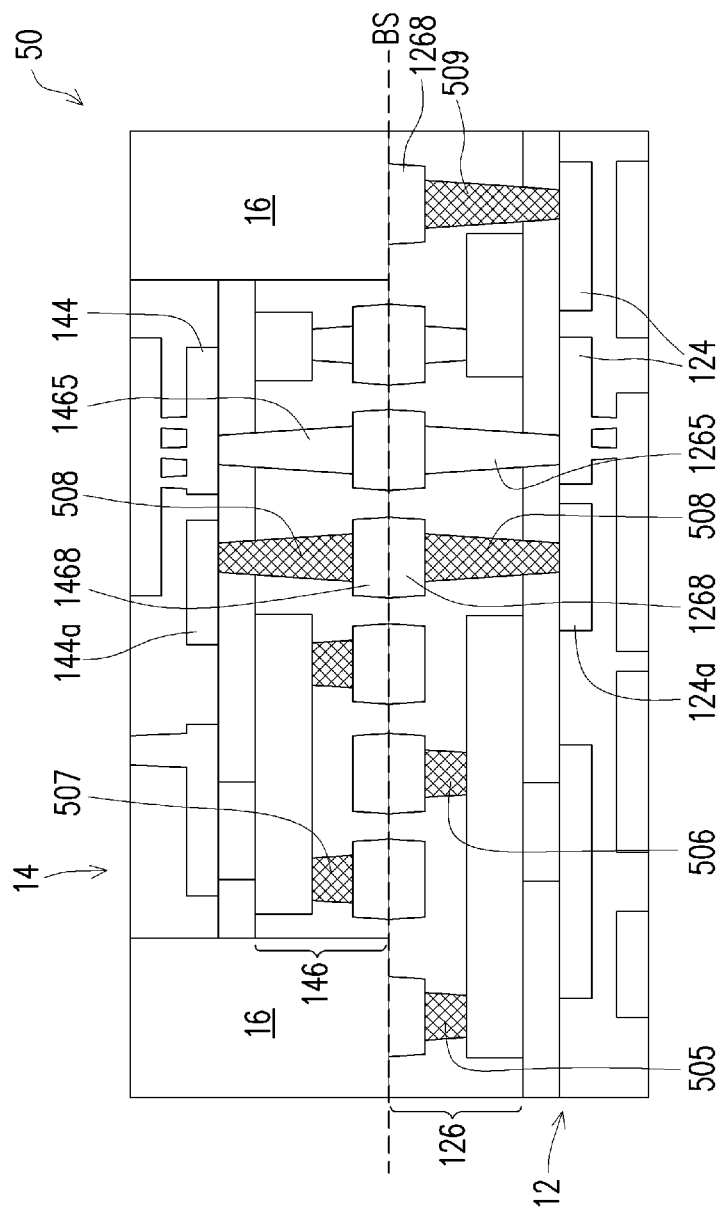
FIG. 5 illustrates a cross-sectional view of a portion of an exemplary 3D stacking structure in accordance with some embodiments of the present disclosure.
Figure 6:
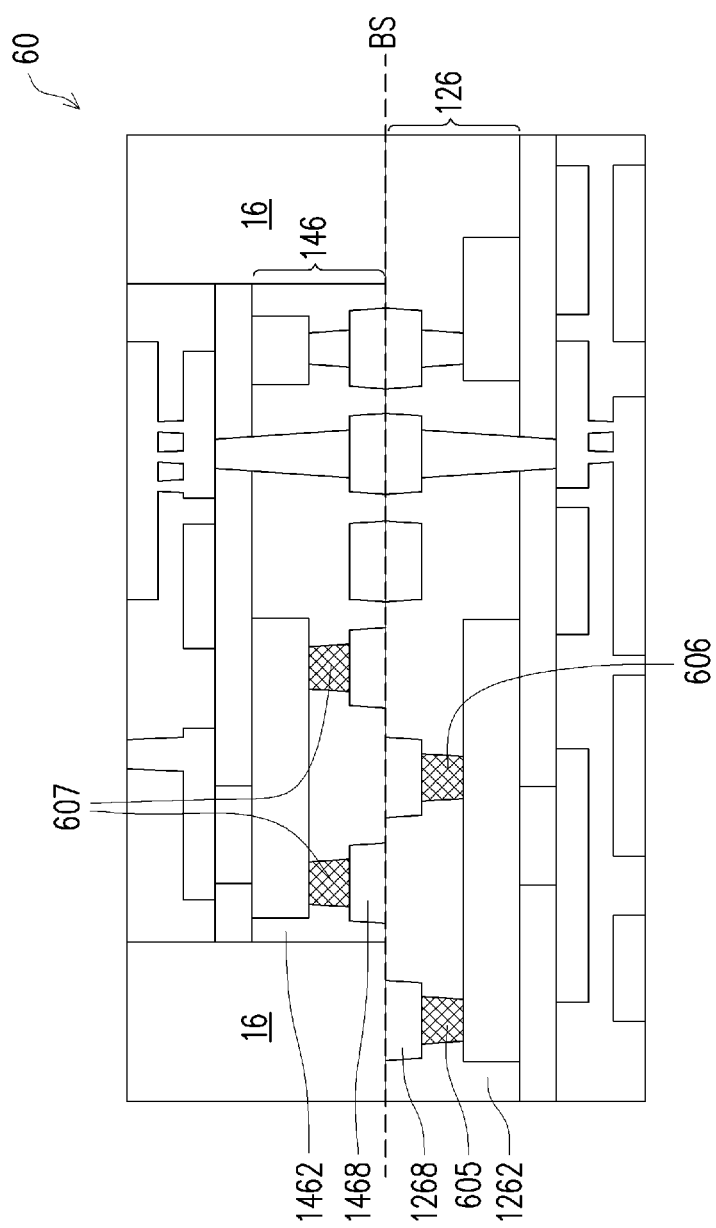
FIG. 6 illustrates a cross-sectional view of a portion of an exemplary 3D stacking structure in accordance with some embodiments of the present disclosure.

FIGS. 4-6 illustrate schematic cross-sectional views of portions of an exemplary 3D stacking structure in accordance with various embodiments of the present disclosure. In the following figures, the bonding portions of the first and second die of the 3D stacking structures are enlarged for descriptions.

Referring to FIG. 4, in some embodiments, the 3D stacking structure 40 comprises heat dissipating elements 405 and 406 that are embedded in the first bonding structure 126 and connected to the bonding pads 1268 of the first bonding structure 126 of the first die 12 as well as heat dissipating elements 407 that are embedded in the second bonding structure 146 of the second die 14 and are connected to the bonding pads 1468 of the second bonding structure 146. For example, the heat dissipating element(s) 405 is located between the bonding pads 1268 and the contact pad 1263 and under the filling material 16, while the heat dissipating element(s) 406 is located between the bonding pads 1268 and the contact pad 1263 and under the second die 14 (within the bonding region). Also, the heat dissipating elements 407 are located between the bonding pads 1468 and the contact pad 1463. The heat dissipating elements 405, 406, 407 are electrically floating, and do not function as electrical connection parts for electrically connecting the dies 12 and 14. The bonding pad vias 1264, 1464 in the first and second bonding structures 126, 146 are respectively located between the contact pads 1263, 1463 and bonding pads 1268, 1468, electrically connecting the first and second metallization structures 124, 144. Like the bonding pad vias 1264, 1464 for electrically connecting the first and second dies, the bonding pad vias 1265, 1465, even connected to the first and second metallization structures 124, 144, function as electrical connection parts. In some embodiments, relative to the bonding interface BS (represented by the dotted line), the bonding pads 1268, 1468 are arranged in a symmetrical form, while the heat dissipating elements 405, 406, 407 are arranged in a staggered form. The heat dissipating elements 405, 406, 407 improve heat dissipation of the 3D stacking structure 40, especially enhancing heat dissipating from the dielectric material(s) of the bonding structures.

Referring to FIG. 5, in some embodiments, the 3D stacking structure 50 comprises heat dissipating elements 505, 506 and 507 that are similar to the heat dissipating elements 405, 406, 407 described in FIG. 4. The 3D stacking structure 50 further comprises heat dissipating elements 508 and 509. For example, the heat dissipating elements 508 are connected to a pair of bonded bonding pads 1268, 1468, respectively penetrating through the first/second bonding structure 126/146 to reach the first/second metallization structures 124/144. Compared with the bonding pad vias 1265, 1465 in the first and second bonding structures 126, 146 for physically and electrically connecting the first and second metallization structures 124, 144, the heat dissipating elements 508 are connected to the floating portions 124a, 144a of the first and second metallization structures 124, 144 and do not function as electrical connection parts. That is, the heat dissipating elements 508 are electrically floating. In addition, the 3D stacking structure 50 comprises one or more heat dissipating elements 509 (only one is shown) located between the bonding pads 1268 and the first metallization structures 124 and under the filling material 16 (outside the bonding region). The heat dissipating element(s) 509 and the connected bonding pad(s) 1268 are electrically floating. The heat dissipating elements 505, 506, 507, 508 and 509 improve heat dissipation of the 3D stacking structure 50, especially enhancing heat dissipating from the dielectric material(s) of the bonding structures.

Referring to FIG. 6, in some embodiments, the 3D stacking structure 60 comprises heat dissipating elements 605 and 606 that are embedded in the first bonding structure 126 and connected to the bonding pads 1268 of the first bonding structure 126 of the first die 12 as well as heat dissipating elements 607 that are embedded in the second bonding structure 146 of the second die 14 and are connected to the bonding pads 1468 of the second bonding structure 146. The main structural difference between the 3D stacking structures 50 and 60 lies in that the bonding pads 1268 do not correspond to the bonding pads 1468 in a one-to-one fashion for the 3D stacking structure 60. In some embodiments, the heat dissipating elements 607 are connected to the bonding pads 1468 that are in direct contact with the dielectric material 1262 of the first bonding structure 126. That is, corresponding to the locations of the bonding pads 1468 that are connected with the heat dissipating elements 607, there are no matching bonding pads in the first bonding structure 126 corresponding the bonding pads 1468 that are connected with the heat dissipating elements 607. In some embodiments, the heat dissipating elements 606 (only one is shown) are connected to the bonding pad 1268 that are in direct contact with the dielectric material 1462 of the second bonding structure 146. In some embodiments, relative to the bonding interface BS (represented by the dotted line), the bonding pads 1268, 1468 are not arranged in a symmetrical form, while the heat dissipating elements 405, 406, 407 are arranged in a staggered form. Such asymmetrical design of the bonding pads may lead to less bonding pads and the layout design may be more flexible. The heat dissipating elements 605, 606, 607 located between the bonding pads and the contact pad improve heat dissipation of the 3D stacking structure 60, especially enhancing heat dissipating from the dielectric material(s) of the bonding structures.

In exemplary embodiments, through the formation and arrangement of the heat dissipating elements, better thermal dissipation is achieved and the production yield and reliability are improved.

In some embodiments of the present disclosure, a stacking structure is provided. The stacking structure includes a first die and a second die. The first die has a first bonding structure, and the first bonding structure includes first bonding pads and a first heat dissipating element. The second die has a second bonding structure, and the second bonding structure includes second bonding pads and a second heat dissipating element. The second die is stacked on the first die, and the first bonding pads are bonded with the second bonding pads. The first and second dies are bonded through the first and second bonding structures. The first heat dissipating element is connected to one first bonding pad of the first bonding pads and the second heat dissipating element is connected to one second bonding pad of the second bonding pads. The one first bonding pad and the first heat dissipating element are electrically floating, and the one second bonding pad and the second dissipating element are electrically floating.

In some embodiments of the present disclosure, a stacking structure including a first die, a second die stacked in the firs die and a filling material is provided. The first die has a first bonding structure, and the first bonding structure includes first bonding pads and a first heat dissipating element. The second die has a second bonding structure, and the second bonding structure includes second bonding pads and a second heat dissipating element. The second die is located in a bonding region of the first die. The first heat dissipating element is connected to one first bonding pad of the first bonding pads and the second heat dissipating element is connected to one second bonding pad of the second bonding pads. The filling material is disposed on the first die, located in a non-bonding region of the first die and beside the second die. The one first bonding pad that is connected with the first heat dissipating element is located in the non-bonding region and below the filling material, and is electrically floating, and the first and second dies are bonded through the first and second bonding structures.

In some embodiments of the present disclosure, a method for forming stacking structures is described. A first wafer with first bonding structures and first metallization structures is provided. The first bonding structure includes a first heat dissipating element. Second dies are provided onto the first wafer, and each second die has a second bonding structure and second metallization structure. The second bonding structure includes a second heat dissipating element. The second die is bonded onto the first wafer through the bonded first and second bonding structures. The first and second heat dissipating elements are electrically floating. A filling material is formed over the first wafer and covers the second die. A dicing process is performed to cut through the filling material and the first wafer to form the stacking structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacking structure, comprising:
   a first die, having a first bonding structure, wherein the first bonding structure includes a first bonding film, first bonding pads embedded in and penetrating through the first bonding film and a first heat dissipating element; and
   a second die, having a second bonding structure, wherein the second die is stacked on the first die, and the second bonding structure includes a second bonding film, second bonding pads embedded in and penetrating through the second bonding film and a second heat dissipating element,
   wherein the first bonding pads are bonded with the second bonding pads, the first and second dies are bonded through the first and second bonding structures, and the first heat dissipating element is connected to one first bonding pad of the first bonding pads and the second heat dissipating element is connected to one second bonding pad of the second bonding pads, and
   wherein the one first bonding pad and the first heat dissipating element are electrically floating, and the one second bonding pad and the second dissipating element are electrically floating.

2. The structure of claim 1, further comprising a filling material disposed on the first die and beside the second die, wherein the one first bonding pad that is connected with the first heat dissipating element contacts the filling material.

3. The structure of claim 1, wherein the one first bonding pad that is connected with the first heat dissipating element contacts the one second bonding pad that is connected with the second heat dissipating element.

4. The structure of claim 3, wherein the first die includes first metallization structures and the second die includes second metallization structures and the first and second heat dissipating elements respectively contact the first and second metallization structures.

5. The structure of claim 1, wherein the one first bonding pad that is connected with the first heat dissipating element contacts one second bonding pad that is unconnected with the second heat dissipating element.

6. The structure of claim 1, wherein the one second bonding pad that is connected with the second heat dissipating element contacts one first bonding pad that is unconnected with the first heat dissipating element.

7. The structure of claim 1, wherein the first bonding structure includes a first dielectric layer laterally wrapping the first heat dissipating element, the second bonding structure includes a second dielectric layer laterally wrapping the second heat dissipating element, and a hybrid bonding interface is located between the first and second bonding film and the first and second bonding pads.

8. The structure of claim 7, wherein the first bonding structure includes a first bonding pad via connected with one first bonding pad of the first bonding pads, the second bonding structure includes a second bonding pad via connected with one second bonding pad of the second bonding pads, the one first bonding pad that is connected with the first bonding pad via contacts the one second bonding pad that is connected with the second bonding pad via, and the first and second dies are electrically connected through the first and second bonding pad vias.

9. A stacking structure, comprising:
   a first die, having a first bonding structure, wherein the first bonding structure includes a first bonding film, first bonding pads embedded in and penetrating through the first bonding film and a first heat dissipating element;
   a second die, stacked on the first die and having a second bonding structure, wherein the second die is located in a bonding region of the first die, and the second bonding structure includes a second bonding film, second bonding pads embedded in and penetrating through the second bonding film and a second heat dissipating element, wherein the first heat dissipating element is connected to one first bonding pad of the first bonding pads and the second heat dissipating element is connected to one second bonding pad of the second bonding pads; and
   a filling material, disposed on the first die, located in a non-bonding region of the first die and beside the second die,
   wherein the one first bonding pad that is connected with the first heat dissipating element is located in the non-bonding region and below the filling material, and is electrically floating, and the first and second dies are bonded through the first and second bonding structures.

10. The structure of claim 9, wherein the first bonding structure includes a third heat dissipating element located in the bonding region, and the third heat dissipating element is connected to one first bonding pad of the first bonding pads.

11. The structure of claim 10, wherein the one first bonding pad that is connected with the third heat dissipating element is in contact with the one second bonding pad that is connected with the second heat dissipating element.

12. The structure of claim 10, wherein the first die further comprises first metallization structures and the third heat dissipating element extends through the first bonding structure to reach the first metallization structures.

13. The structure of claim 9, wherein the first bonding pads are bonded with the second bonding pads.

14. The structure of claim 9, wherein some of the first bonding pads are in contact with the filling material.

15. The structure of claim 9, wherein the one first bonding pad that is connected with the first heat dissipating element is in contact with the filling material.

16. The structure of claim 15, wherein the first die further comprises first metallization structures and the first heat dissipating element extends through the first bonding structure to reach the first metallization structures.

17. A stacking structure, comprising:
- a first die, having a first bonding structure, wherein the first bonding structure includes a first bonding film, first bonding pads embedded in and penetrating through the first bonding film and a first heat dissipating element; and
- a second die, having a semiconductor substrate, a through substrate via penetrating through the semiconductor substrate and a second bonding structure, wherein the second die is stacked on the first die, and the second bonding structure includes a second bonding film, second bonding pads embedded in and penetrating through the second bonding film and a second heat dissipating element,
- wherein the first bonding pads are bonded with the second bonding pads, the first and second dies are bonded through the first and second bonding structures, and the first heat dissipating element is connected to one first bonding pad of the first bonding pads and the second heat dissipating element is connected to one second bonding pad of the second bonding pads, and
- wherein the one first bonding pad and the first heat dissipating element are electrically floating, and the one second bonding pad and the second dissipating element are electrically floating.

18. The structure of claim 17, wherein the first bonding structure includes a first dielectric layer that is located below the first bonding film and laterally wraps the first heat dissipating element, the second bonding structure includes a second dielectric layer that is located on the second bonding film and laterally wraps the second heat dissipating element.

19. The structure of claim 18, further comprising a filling material disposed on the first die and beside the second die, wherein the one first bonding pad that is connected with the first heat dissipating element contacts the filling material.

20. The structure of claim 19, wherein the filling material contacts the first and second bonding films and the second dielectric layer without contacting the first dielectric layer.

\* \* \* \* \*